US008207031B2

(12) United States Patent
Ellmers et al.

(10) Patent No.: US 8,207,031 B2
(45) Date of Patent: Jun. 26, 2012

(54) MASK-SAVING PRODUCTION OF COMPLEMENTARY LATERAL HIGH-VOLTAGE TRANSISTORS WITH A RESURF STRUCTURE

(75) Inventors: Christoph Ellmers, Dresden (DE); Thomas Uhlig, Dresden (DE); Felix Fuernhammer, Dresden (DE); Michael Stoisiek, Erlangen (DE); Michael Gross, Eckental (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 193 days.

(21) Appl. No.: 12/593,310
(22) PCT Filed: Mar. 26, 2008
(86) PCT No.: PCT/EP2008/053565
§ 371 (c)(1),
(2), (4) Date: Apr. 26, 2010
(87) PCT Pub. No.: WO2008/116880
PCT Pub. Date: Oct. 2, 2008

(65) Prior Publication Data
US 2010/0311214 A1      Dec. 9, 2010

(30) Foreign Application Priority Data

Mar. 26, 2007 (DE) .......................... 10 2007 016 089
Jul. 23, 2007 (DE) .......................... 10 2007 034 800

(51) Int. Cl.
*H01L 21/8238* (2006.01)
(52) U.S. Cl. ........ 438/199; 438/214; 438/221; 438/275; 438/289; 257/E21.632
(58) Field of Classification Search .................. 438/199, 438/214, 221, 275, 289; 257/E21.632
See application file for complete search history.

(56) References Cited

U.S. PATENT DOCUMENTS
4,626,879 A   12/1986 Colak
(Continued)

FOREIGN PATENT DOCUMENTS
DE         103 01 496         8/2004
(Continued)

OTHER PUBLICATIONS

Akio Kitamura, et al., "Self-Isolated and High Performance Complementary Lateral DMOSFETs with Surrounding-Body Regions," Proceedings of the 7th International Symposium on Power Semiconductor Devices and IC's; New York, IEEE; May 23, 1995; pp. 42-47.
(Continued)

*Primary Examiner* — Thanh V Pham
(74) *Attorney, Agent, or Firm* — Hunton & Williams

(57) ABSTRACT

Methods of forming, on a substrate, a first lateral high-voltage MOS transistor and a second lateral high-voltage MOS transistor complementary to said first one are disclosed. According to one embodiment, the method includes (1) providing a substrate of a first conductivity type including a first active region for said first lateral high-voltage MOS transistor and a second active region for said second lateral high-voltage MOS transistor and (2) forming at least one first doped region of the first conductivity type in the first active region and forming in the second active region a drain extension region of the second conductivity type extending from a substrate surface to an interior of the substrate, including a concurrent implantation of dopants through openings of one and the same mask into the first and second active regions. Forming of the at least one first doped region may be a sub step of a superior step of forming a double RESURF structure in the first lateral high-voltage MOS transistor, and forming the double RESURF structure may include forming doped RESURF regions as two first doped regions, one thereof above and one thereof below the drift region of the first lateral high-voltage MOS transistor, and as two further doped regions, one thereof above and one thereof below the drain extension regions of the second lateral high-voltage MOS transistor, wherein the first doped RESURF regions have an inverse conductivity type with respect to the drift region and the further doped regions have inverse conductivity type as compared to the drain extension region.

13 Claims, 9 Drawing Sheets

U.S. PATENT DOCUMENTS

| | | | |
|---|---|---|---|
| 4,918,026 | A | 4/1990 | Kosiak et al. |
| 5,338,960 | A | 8/1994 | Beasom |
| 5,382,820 | A | 1/1995 | Yang et al. |
| 5,852,314 | A | 12/1998 | Depetro et al. |
| 6,168,983 | B1 | 1/2001 | Rumennik et al. |
| 6,424,007 | B1 | 7/2002 | Disney |
| 6,451,640 | B1 | 9/2002 | Ichikawa |
| 6,878,603 | B2 | 4/2005 | Bromberger et al. |
| 2003/0193067 | A1 | 10/2003 | Kim et al. |
| 2004/0159893 | A1 | 8/2004 | Kitahara |
| 2007/0284659 | A1* | 12/2007 | Abadeer et al. ............... 257/343 |
| 2008/0061376 | A1* | 3/2008 | Williams et al. ............. 257/371 |
| 2008/0135934 | A1* | 6/2008 | Liu ................................. 257/343 |
| 2008/0237656 | A1* | 10/2008 | Williams et al. ............. 257/262 |
| 2008/0237783 | A1* | 10/2008 | Williams et al. ............. 257/513 |

FOREIGN PATENT DOCUMENTS

| | | |
|---|---|---|
| EP | 0 741 416 | 11/1996 |
| EP | 1 271 637 | 1/2003 |

OTHER PUBLICATIONS

PCT International Search Report for PCT/EP2008/053565 mailed Jun. 25, 2008; 4 pages (German Language).

PCT Written Opinion of the International Searching Authority for PCT/EP2008/053565; 6 pages (German Language).

Ehwald, K.E. et al., "A Two Mask Complementary LDMOS Module Integrated in a 0.25 μm SiGe:C BiCMOS Platform," IHP, Im Technologies, pp. 121-124 (2004).

* cited by examiner

MASK-SAVING PRODUCTION OF COMPLEMENTARY LATERAL HIGH-VOLTAGE TRANSISTORS WITH A RESURF STRUCTURE

CROSS-REFERENCE TO RELATED APPLICATIONS

The application is a U.S. National Stage Application of International Application of PCT/EP08/53565 filed Mar. 26, 2008, which claims priority of German Patent Application No. 10 2007 016 089.7 filed Mar. 26, 2007 and German Patent Application No. 10 2007 034 800.4 filed Jul. 23, 2007, the disclosures of which are herein incorporated by reference in their entirety.

FIELD OF THE DISCLOSURE

The invention relates to a method for fabricating a lateral high-voltage MOS transistor and a complementary second lateral high-voltage MOS transistor on a substrate.

BACKGROUND OF THE DISCLOSURE

Lateral high-voltage MOS transistors having an n-conductive channel are typically formed on p-conductive wafers in the form of a DMOS transistor, in which a topology of the doped zones corresponds to a "double-diffused" MOS, in short DMOS transistor, wherein a drain region is of the same conductivity type as a well doping, i.e., of an n-type conductivity. Lateral high-voltage transistors having a p-conductive channel, i.e., high-voltage MOS transistors being complementary to the former transistor, are fabricated on p-conductive wafers typically in the form of a drain extension transistor, in which drain and drift regions are of inverse conductivity type compared to the n-well that is also provided in this case. In the context of the present application the term lateral high-voltage MOS transistor describes both of these transistor types.

In lateral DMOS (LDMOS) transistors for applications using high electric voltages it is known from U.S. 2003/0193067 A1 (FIG. 2) to use a so-called double RESURF structure. RESURF is the abbreviation of the term reduced surface field.

A double RESURF structure comprises a doped region above and below a drift region or a drain extension region of an LDMOS transistor that has the inverse conductivity type compared to a drift region and a drain extension region, respectively. If, for example, the drift region is n-conductive, then the substrate region positioned below and the doped region incorporated in the drift zone are p-conductive. The doped regions typically have a dopant concentration in the same order of magnitude as the drift region, however, in the vertical direction an integrated total doping of at most about $1*10^{12}$ cm$^{-2}$.

Upon applying a voltage to the drain electrode of the lateral high-voltage transistor by means of the double RESURF structure a depletion zone is generated, which extends along the boundary between the drift region and a substrate region positioned below of inverse conductivity type. A further depletion zone forms between the drift region itself and the doped region incorporated below the surface of the drift region.

In this manner a full depletion of the drift region with respect to charge carriers is caused by these two reverse-biased pn junctions, thereby resulting in a desired increase of the breakthrough voltage of the lateral high-voltage MOS transistor. At the same time the concentration of charge carriers in the drift region can be increased by incorporating the doped region into the drift region, thereby reducing the on-resistance of the lateral high-voltage MOS transistor. This is because the magnitude of the breakthrough voltage in reversed bias mode is solely determined by the integrated net doping of the drift region and of the doped regions incorporated therein. For this purpose, however, the incorporated doped region compensates the dopant concentration of the drift region. Hence, relatively high dopant concentrations may be used in the drift region, thereby resulting in an increase of its conductivity and thus reducing $R_{on}$ without reducing the breakthrough voltage. The method can appropriately be extended to the incorporation of a plurality of stacked p-zones into the drift zone, which are separated from each other, and this is then referred to as a multi RESURF structure or as a superjunction structure.

The production of such multiple RESURF structures together with other components, in particular with complementary high-voltage MOS transistors, is, however, complex and requires additional masking steps for incorporating the doped regions into the drift region compared to simple lateral high-voltage MOS transistors.

The technical object underlying the present invention is to provide a method for fabricating a first lateral high-voltage MOS transistor and a second lateral high-voltage MOS transistor complementary to the former one, with which a double or multiple RESURF structure can be formed with reduced effort.

SUMMARY OF THE DISCLOSURE

According to the invention a method for fabricating a first lateral high-voltage MOS transistor and a second lateral high-voltage MOS transistor complementary the former one on a substrate comprises the following steps, wherein each of the first and second lateral high-voltage MOS transistors includes a drift region of inverse conductivity type:
  providing a substrate of a first conductivity type including a first active region of the second conductivity type for the first lateral high-voltage MOS transistor and a second active region of the second conductivity type for the second lateral high-voltage MOS transistor,
  forming at least one first doped region of the first conductivity type in the first active region and forming a drain extension region of the first conductivity type in the second active region so as to extend from the substrate surface to the substrate interior, which comprises a concurrent implantation of a dopant into the first and second active regions through respective mask openings of one and the same mask.

In the inventive fabrication method an implantation step for forming a drain extension region in the second active region for the second lateral high-voltage MOS transistor is used for the concurrent formation of a first doped region for a double RESURF structure in the first lateral high-voltage MOS transistor. Surprisingly, it is possible to form the drain extension region of the second lateral high-voltage MOS transistor as well as the first doped region for the double RESURF structure of the first lateral high-voltage MOS transistor in one and the same implantation step under identical implantation conditions. Hence, only respective mask openings in one and the same mask in the range of the first and second active regions are required. In this manner an integrated circuit including complementary lateral high-voltage MOS transistors, i.e., lateral high-voltage MOS transistors of different conductivity type, may be fabricated in a particularly efficient and cost effective manner.

In the following there are described embodiments of the inventive method. The embodiments may be combined with each other, unless specifically set forth to the contrary.

The provision of the substrate preferably comprises the fabrication of the first and second active regions of the second conductivity type that is inversed to the conductivity type of the substrate. This may be accomplished by means of a masked implantation of deep well region within the active regions. The well regions cause an electrical isolation of the lateral high-voltage transistors from the substrate. For example, the second conductivity type is an n-conductivity, while the first conductivity type which is that of the substrate is a p-conductivity.

In an embodiment of the inventive method that is alternative to the above one, a substrate of n-conductivity is provided and the well regions are thus p-conductive.

In an embodiment of the inventive method a plurality of doped regions laterally offset from each other is formed.

In a further embodiment of the inventive method the following steps are performed prior to the implantation step:
 blanket-depositing a mask layer on the substrate;
 forming at least one mask opening for the implantation of the first doped region in the first active region and a second mask opening for the implantation of the drain extension region in the second active region.

In a further embodiment providing the substrate comprises the forming of a trench partly or completely filled with an electrically insulating material in the first active region or in both the first active region and the second active region in the lateral area of a respective future drift region of the lateral high-voltage MOS transistor to be formed there.

In a further embodiment of the inventive method the implantation of the dopant in the at least one first doped region is performed through at least a first mask opening, which, when considered in cross-section of the emerging first DMOS transistor, forces a lateral restriction of the first doped region to at most the lateral extension of the trench etch mask. The assignment of the implantation region to the trench structure may be accomplished in a self-adjusting manner with respect to the trench boundary, for instance, by concurrently using the trench etch mask for masking the drift zone implantation. In one variant of this embodiment in this way the first doped region is generated in the first active region by the masked implantation after forming the trench and/or the drain extension region is formed in the second active region with a lateral extension that at least partially overlaps with the refilled trench (where present) or is even identical thereto.

In a further embodiment of the inventive method providing the substrate comprises forming the trench in a shallow trench technology, or, alternatively, in a LOCOS technology. The refilled trench may also act as a field isolation region. It is preferably be formed together with field isolation regions that delineate the first and second active regions.

In a further embodiment of the inventive method the forming of the first doped region is a first sub step of a superior step of the forming of a double RESURF structure in the first lateral high-voltage MOS transistor.

In a further embodiment of the inventive method source and drain regions are formed in the respective DMOS transistor after forming the first doped region in the first lateral high-voltage MOS transistor and the drain extension region in the second lateral high-voltage MOS transistor.

In a further embodiment of the inventive method, prior to forming the first doped region, a gate isolation layer is formed that laterally overlaps partially of fully with the trench.

In the following an embodiment of the inventive production method is described while referring to the attached figures.

DETAILED DESCRIPTION OF EXEMPLARY EMBODIMENTS

FIGS. 1 to 16 show produced structures in a pure schematic illustration. In particular, the figures are not intended to reflect the real lateral extensions and depth extensions and boundaries of the respective features, as could be made visible, for instance, in cross-sectional views of an electron microscope.

For example, the field isolation regions shown in the figures are shown exclusively in a schematic manner. Their depicted lateral extension is reduced for reasons of simplified graphical illustration. Compared to what is shown, they may have a significantly greater lateral extension relative to other features. These design details are well-known to the skilled person so that for conveying the essential information herein it is not intended to provide a specifically real illustration but rather a compact graphical illustration is used.

In FIGS. 1 to 15 in the left half of a respective figure a stage of production of a P-DEMOS transistor for high-voltage applications is shown, and in the right half there is shown a stage of production of an N-DMOS transistor for high-voltage applications. A wiggly line extending vertically between the structures of the P-DEMOS transistor and the N-DMOS transistor indicates that both transistors do not need to be positioned in immediate neighbourhood to each other. This continuous illustration in FIGS. 1 to 15 is selected for convenience.

In the following, by means of FIGS. 1 to 15 various production phases of a wafer including a lateral NDMOS transistor and a lateral P-DEMOS transistor will be described in more detail according to an illustrative embodiment. The drawings are purely schematic. The size ratios in this figure and any following figures are not true to scale.

Figure 1:
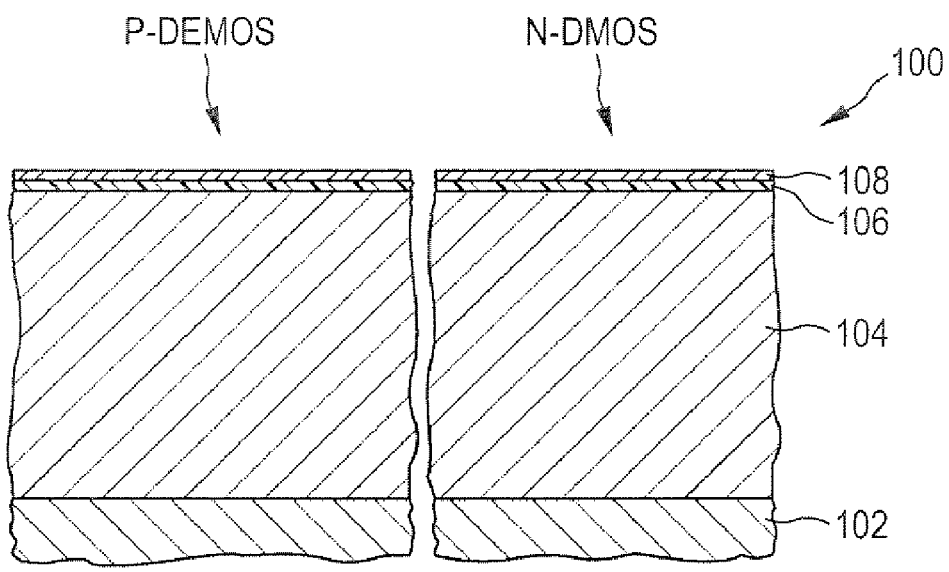
FIG. 1 to FIG. 15 show cross-sectional views of a wafer including a lateral N-DMOS transistor that comprises a double RESURF structure, and a lateral P-DEMOS (P drain extension MOS transistor) during different production phases.

FIG. 1 shows in cross-sectional view two sections of a prepared p+ doped semiconductor wafer 102 that is comprises, for instance, of silicon. In a first respectively denoted wafer section, that is, a first active region denoted as "NDMOS", during the further advance of the subsequently described method an N-DMOS transistor will be formed that is also denoted as first high-voltage MOS transistor. In a second wafer section, that is, a second active region denoted as "P-DEMOS", a P-DEMOS transistor will be formed that is also denoted as second high-voltage MOS transistor.

In the method stage shown an epitaxial p-doped silicon layer, in short a p-epi layer 104, is provided and thereon a pad oxide layer 106 is deposited, which in turn is covered by a cap layer 108. An appropriate method for manufacturing the pad oxide layer 106 is the thermal oxidation of the wafer surface.

For forming the cap layer 108 the application of a silicon nitride layer (SiN, e.g., in the form of $Si_3Ni_4$) by means of a CVD technique is appropriate.

Figure 2:
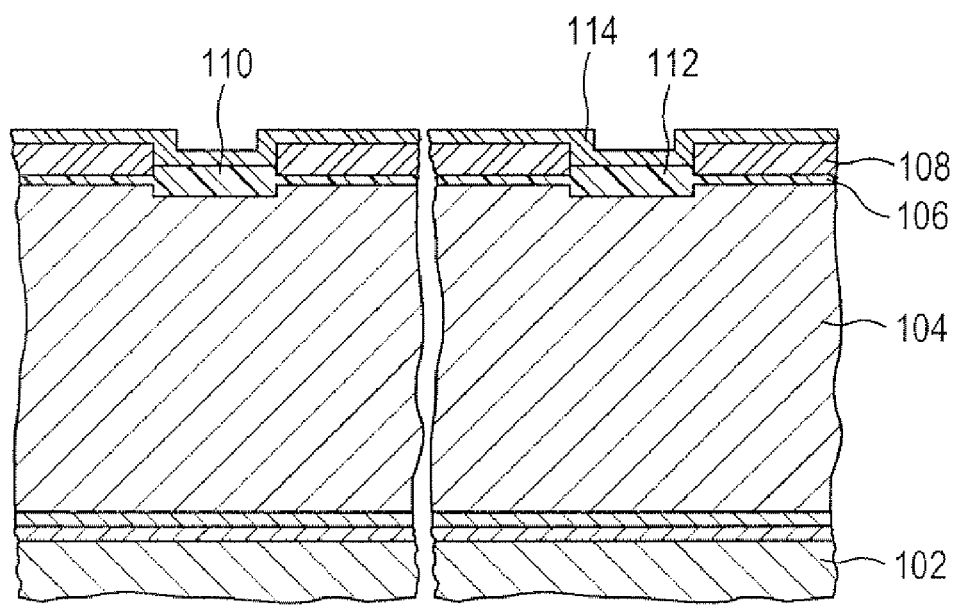

FIG. 2 shows the wafer 102 after the deposition of a gate oxide layer 110 of the P-DEMOS transistor and a gate oxide layer 112 of the N-DMOS transistor. Furthermore, a second cap layer 114 has been deposited on the entire illustrated wafer surface. For example, for the fabrication of the gate oxide layer 112 by a lithography step an etch mask is patterned on the surface such that the areas for the gate oxide layer remain exposed. An appropriate etch technique is a wet chemical etch process. Thereafter, the etch mask is removed, for instance, by ashing in an oxygen atmosphere at a high temperature. This step is known to the skilled person and will no longer be mentioned in the following lithography steps. Moreover, cleaning steps for the gate areas may follow.

Thereafter, the exposed gate areas are thermally oxidized. Preferable, it is not wet-oxidized, since in this manner a denser oxide layer is obtained. Then, the second cap layer 114 is applied. This may be accomplished by a CVD process.

Figure 3:
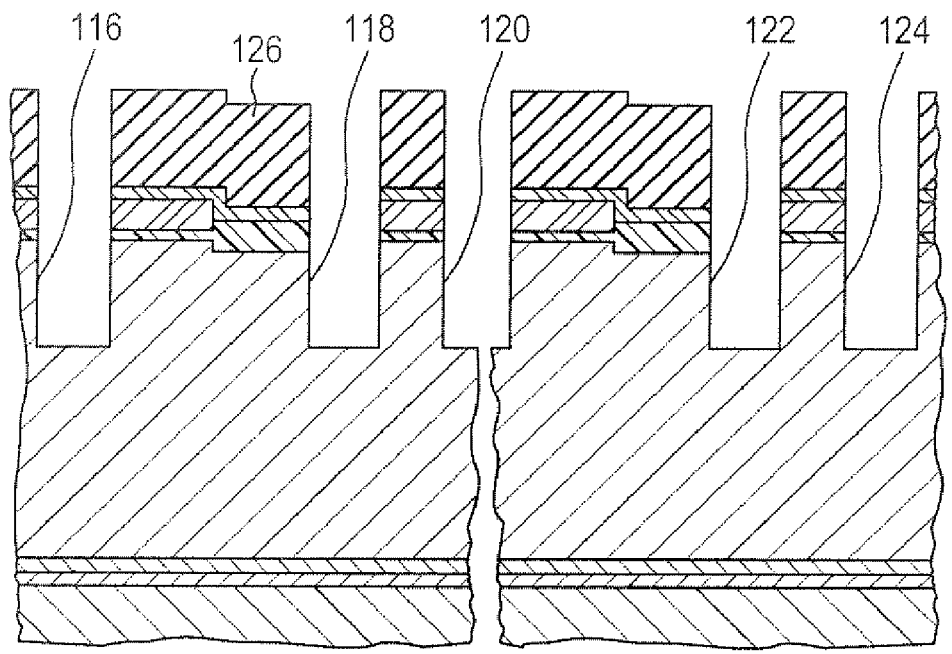

FIG. 3 shows the wafer 102 in a subsequent method stage, in which a patterned lithography mask is formed on the surface. Shallow trenches 116 to 124 have been formed in the wafer surface. An appropriate manufacturing technique for the shallow trenches 116 to 124 is reactive ion etching (RIE).

Figure 4:
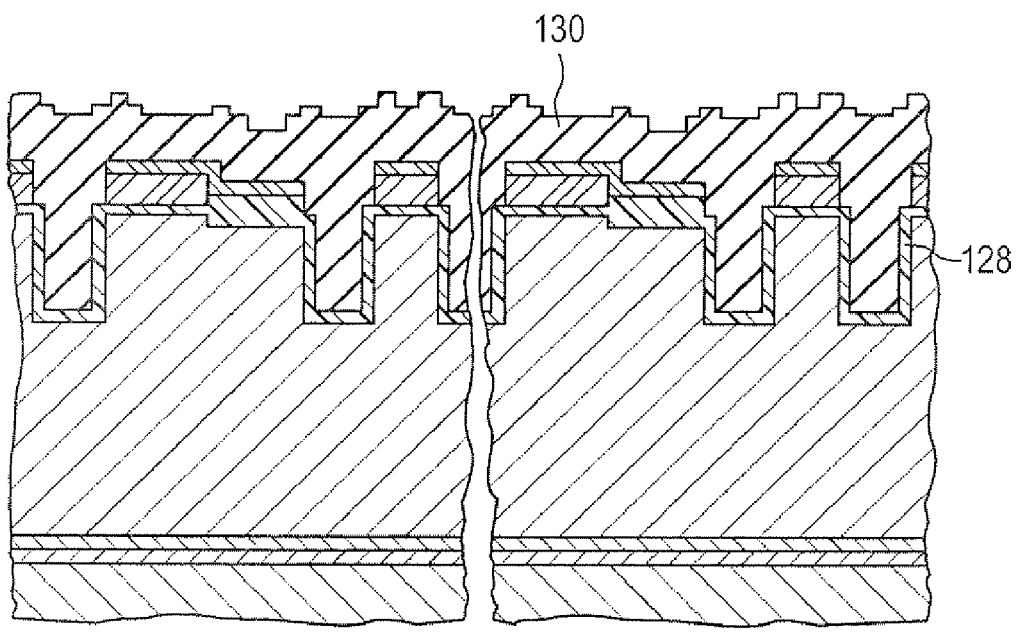
Figure 5:
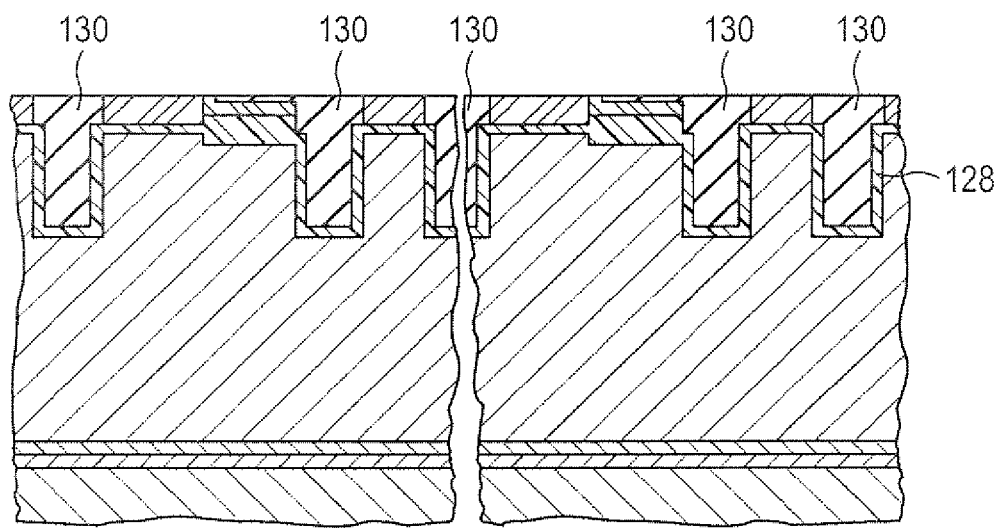

FIG. 4 shows the wafer in a subsequent process phase with the shallow trenches, in which an oxide liner 128 is provided, comprising thereon a shallow trench isolation layer 130, with which the shallow trenches are filled. Silicon dioxide ($SiO_2$) is an appropriate material for the oxide liner 128 and the shallow trench isolation layer 130. The oxide liner 128 and the shallow trench isolation layer 130 may be annealed after growth of deposition. An appropriate method therefor is high density plasma deposition, which produces very dense oxides having a good fill behaviour. FIG. 5 shows the wafer 102 in a subsequent method stage with a smoothed surface, wherein parts of the shallow trench isolation layer 130 and the second cap layer 114 have been removed. An appropriate technique for smoothing the surface is the chemical mechanical polishing (CMP).

Figure 6:
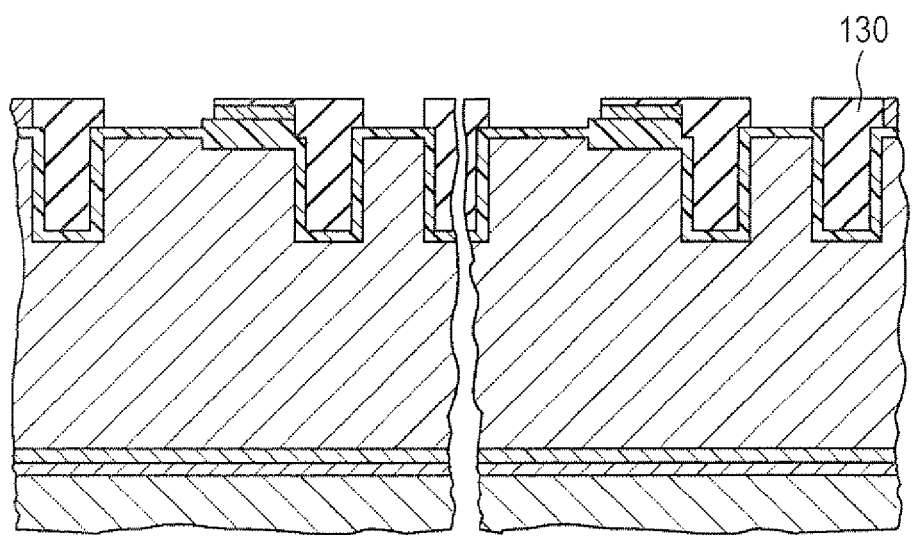

FIG. 6 shows the wafer 102 in a subsequent method stage, in which further sections of the second cap layer 114 are removed. The second cap layer 114 is present only between the gate oxide layer 110 and a part of the shallow trench isolation layer that extends laterally beyond the gate oxide layer and that has not been removed during the CMP method step. The second cap layer 114 may be removed, for instance, by a wet chemical etch process. For example, an HF bath is appropriate as an etch agent for a second cap layer comprised of silicon nitride.

Figure 7:
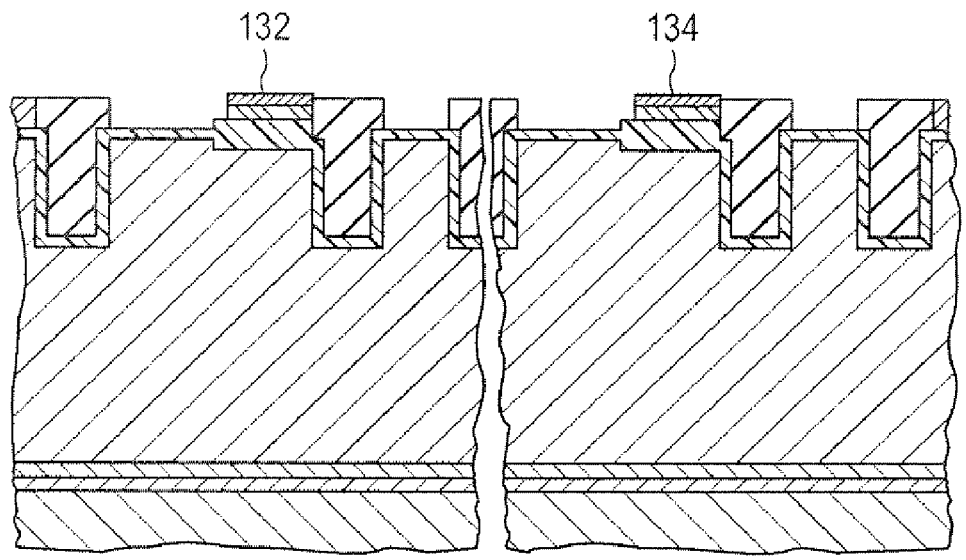

FIG. 7 shows a subsequent method stage, in which the part of the shallow trench isolation layer that laterally extends beyond the gate oxide layer has been removed. Thereafter, an oxide layer 132, 134 has been applied in the same position above the gate oxide layer 110, 112 as a sacrificial oxide layer.

Figure 8:
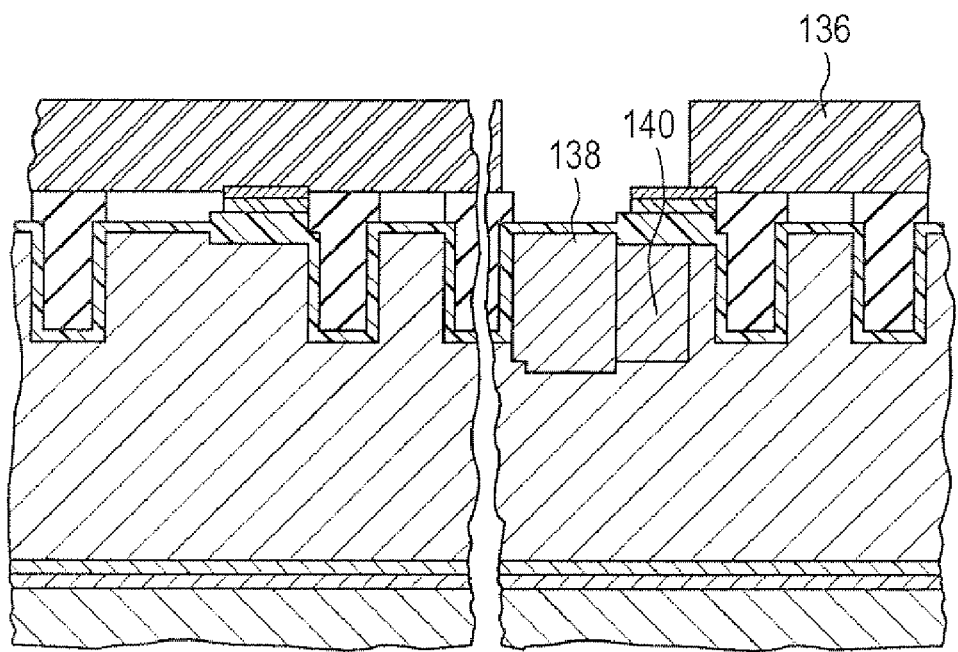

FIG. 8 illustrates a stage, in which an implantation mask 136 is formed on the wafer surface. In one implantation step a p-doped region 140 and a p-body 138 has been formed in the active region of the NDMOS transistor. For the p-doping boron (B) is appropriate. For generating an appropriate doping profile in the vertical direction several implantation steps at different particle energies may be used.

Figure 9:
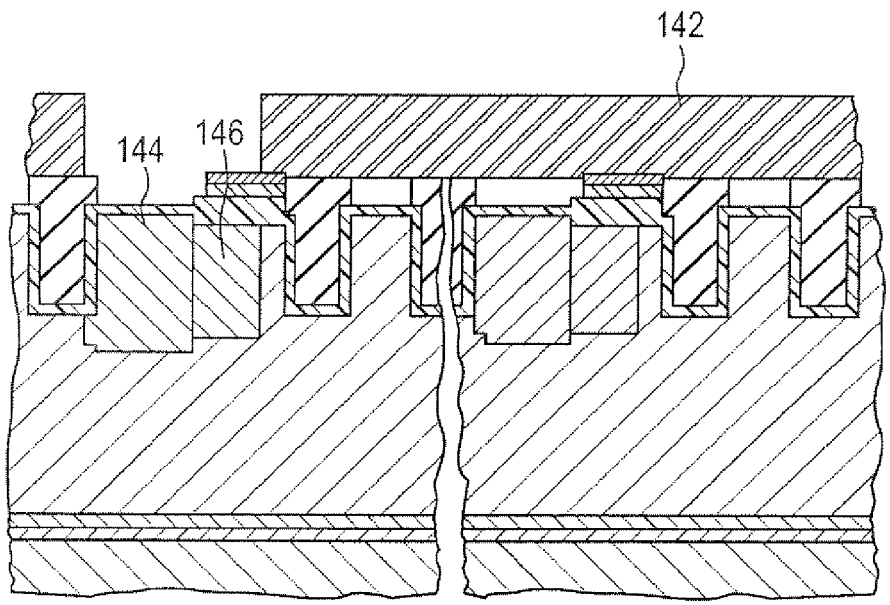

FIG. 9 shows the wafer 102 after a further implantation step, in which an n-doped region 146 and an n-body region 144 have been formed in the second active region for the P-DEMOS transistor. To this end, an implantation mask 142 has been patterned by photolithography. Appropriate dopants for an n-doping are arsenic (As) and phosphorous (P). Also in this case, several implantation steps may be used.

Figure 10:
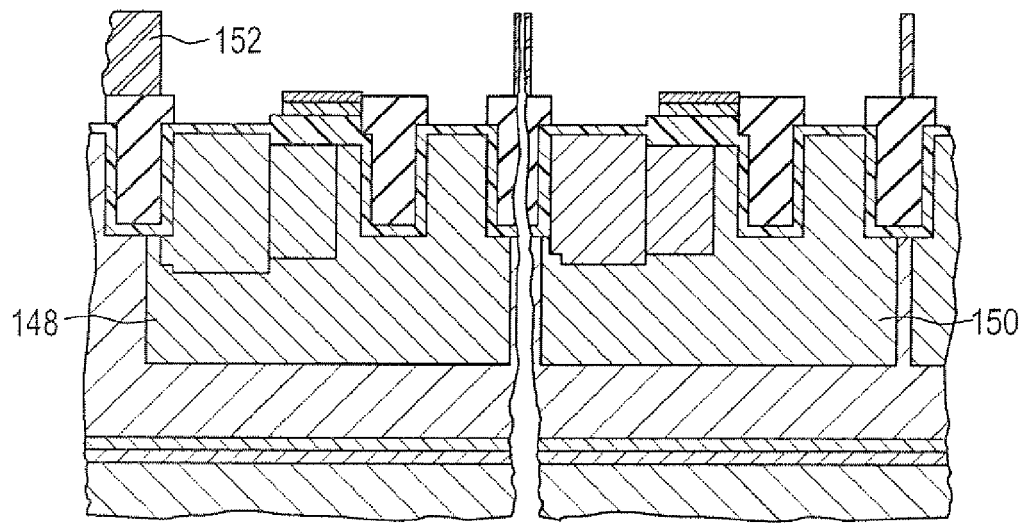

In the process stage of FIG. 10 the wafer is shown with a further implantation mask 152. By means of a further implantation step deep n-conductive trenches 148 and 150 are formed. By using several implantation steps a desired vertical doping profile may be formed with high precision. That means that for the generation of the vertical doping profile several times particles of different penetration depth are implanted. The penetration depth is adjustable via the acceleration voltage of the ion source. Phosphorous (P) is an appropriate dopant. After or between the implantation steps anneal steps may be performed so as to cure the doped regions.

Figure 11:
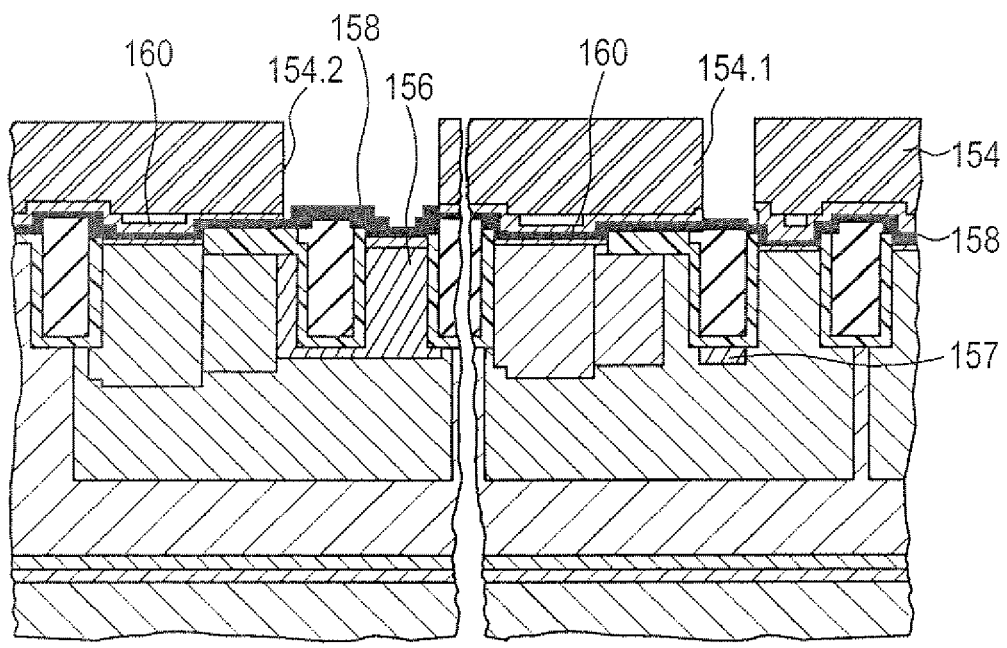

FIG. 11 shows the wafer 102 in a subsequent method stage with a further implantation mask 154 that comprises a first mask opening 154.1 for generating a first doped region for a double RESURF structure 157 and that comprises a second mask opening 154.2 for generating a p-doped drain extension region 156 extending from the substrate surface to the interior of the substrate. A temporary cap layer 158 and an insulator layer 160 are deposited on the surface. The insulator layer 160 is removed in the area of the two mask openings 154.1 and 154.2 of the implantation mask.

The fabrication of the first doped region of the double RESURF structure in the NDMOS transistor and of the drain extension region in the P-DEMOS transistor by a concurrently implanting dopants through the respective mask openings is accomplished in this method in one and the same mask step, that is, using one and the same implantation mask. The first doped region and also the drain extension region are p-doped. Boron (B) is an appropriate dopant.

In this embodiment the first doped region 157 for the double RESURF structure is to formed exclusively below a shallow trench 122 in the first active region of the NDMOS transistor. A first mask opening 154.1 for the double RESURF structure thus results in a lateral restriction of the first doped region 157 to the lateral extension of the shallow trench in the first active region.

Figure 12:
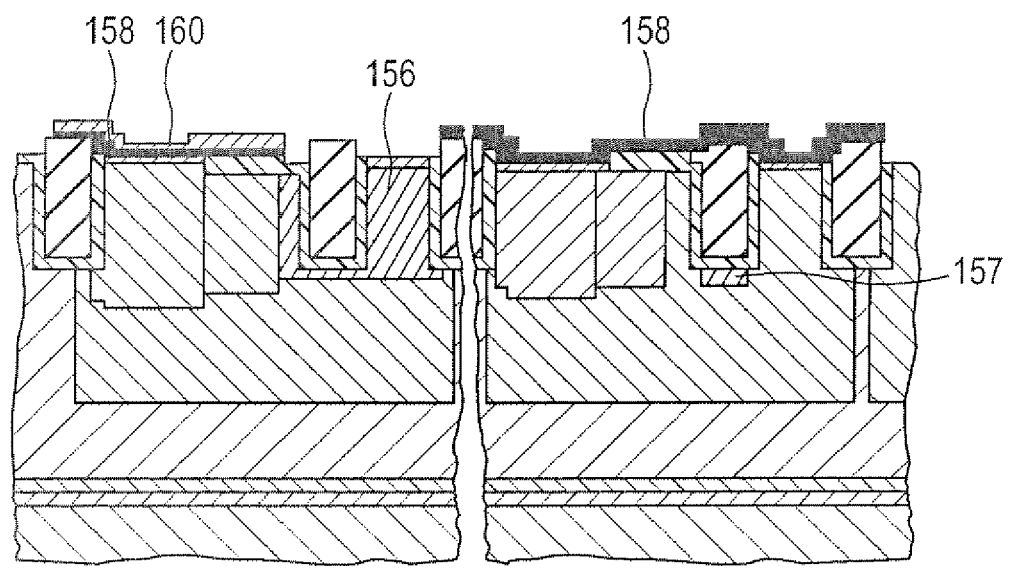
Figure 13:
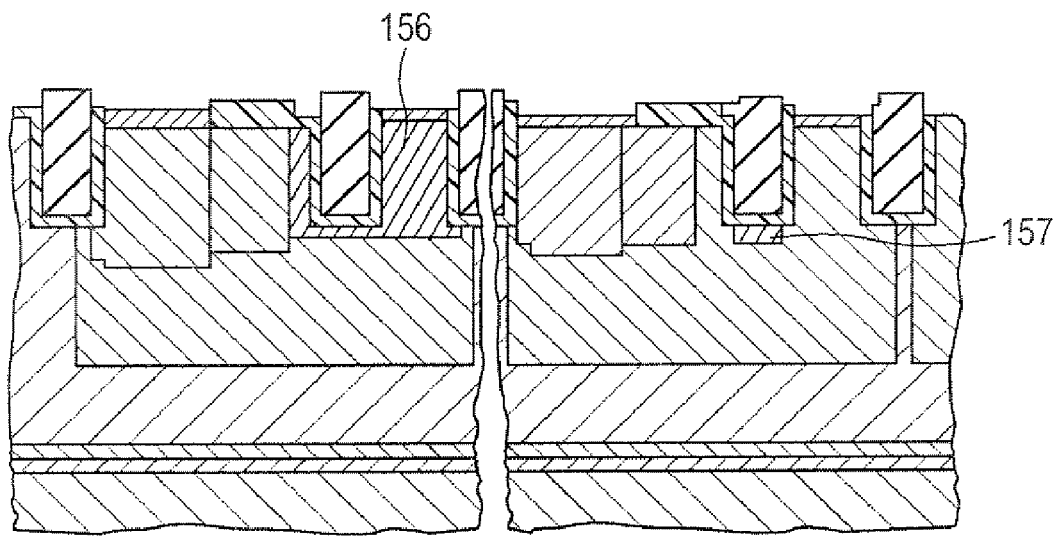

FIG. 12 shows a method stage of a following intermediate step during the removal of an insulator layer 160 and the temporary cap layer 158. The removal may also be performed by several steps of selective etching. FIG. 13 shows the wafer sections after the complete removal of the insulator layer 160 and the temporary cap layer 158.

Figure 14:
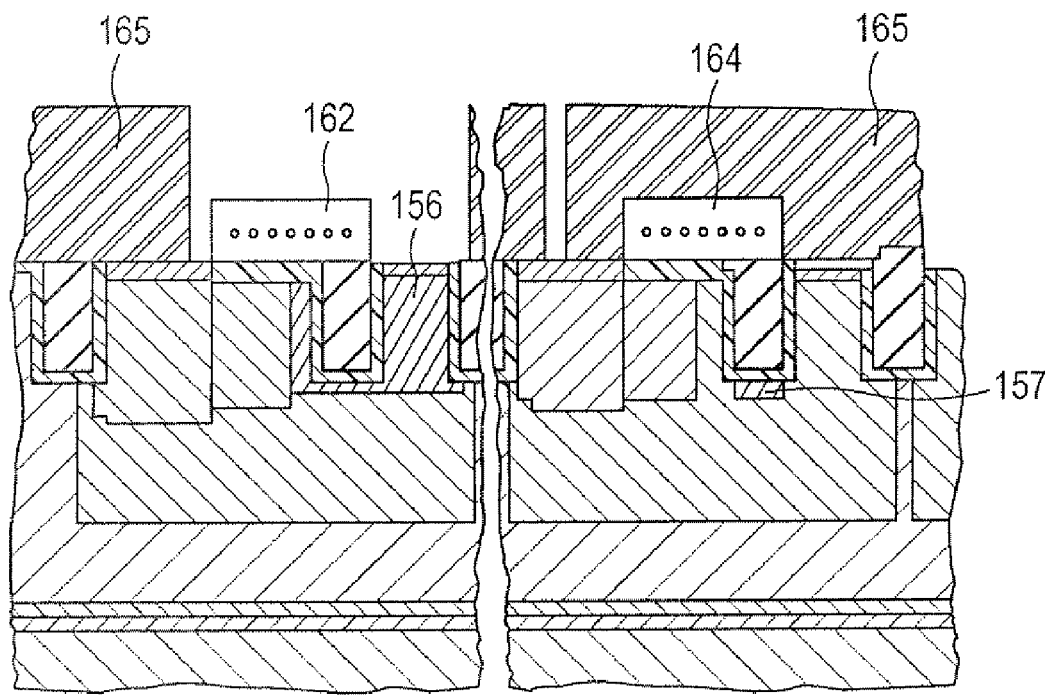

In a subsequent step illustrated in FIG. 14 a gate oxide layer 164 for the first lateral high-voltage transistor and a gate oxide layer 162 for the second lateral high-voltage transistor have been formed. To this end an oxide layer may be deposited on the entire wafer surface. Thereafter, the lateral extension of the gate oxide layers 162 and 164 may be patterned by an etch mask and an etch step. The gate oxide layer is also referred to as gate insulation layer. In this embodiment the gate oxide layers 162, 164 overlap with the shallow trenches 118 and 122.

In this figure there is also illustrated on the wafer sections a photolithographically patterned implantation mask 165. This implantation mask 165 is used for the implantation of the p-doped source/drain regions of the P-DEMOS transistor and of a p-doped region of the source region of the N-DMOS transistor illustrated in FIG. 15.

Figure 15:
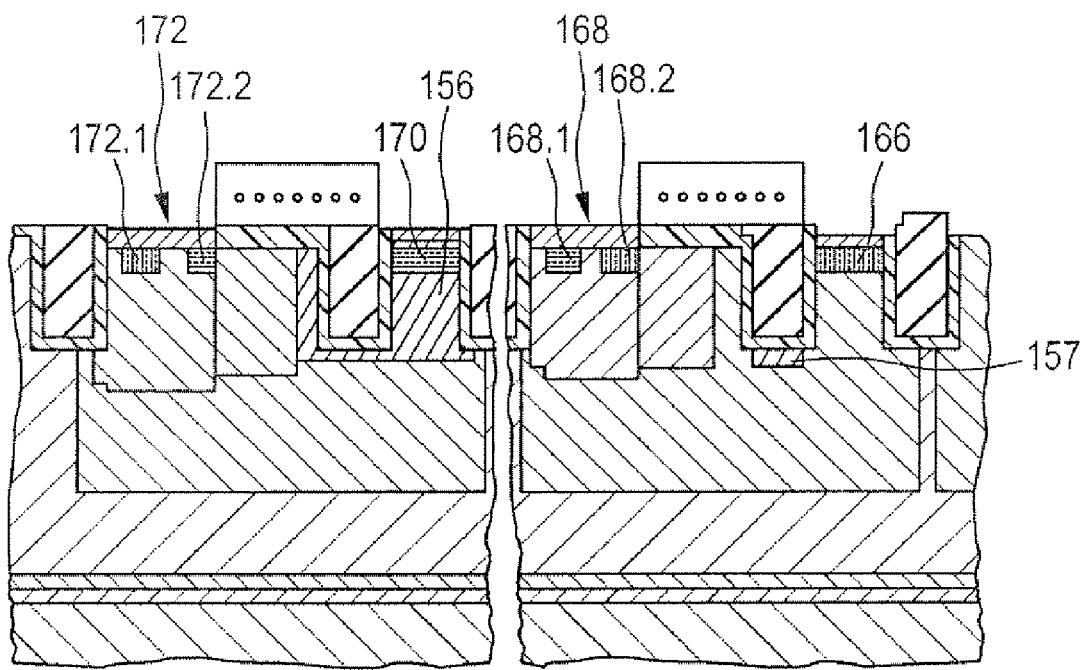

FIG. 15 shows the lateral high-voltage transistors after completing the source regions 168 and 172 and the drain regions 166 and 170. The source and drain regions 168 and 172 are formed by means of two implantation steps using two patterned implantation masks, of which is illustrated in FIG. 14 the implantation mask for doping the p-doped regions. A further implantation mask having corresponding mask openings is used for the fabrication of the n-doped region of the source region 172.1 of the P-DEMOS transistor, the n-doped region of the source region 168.2 of the N-DMOS transistor and the drain region 166 of the N-DMOS transistor.

Figure 16:
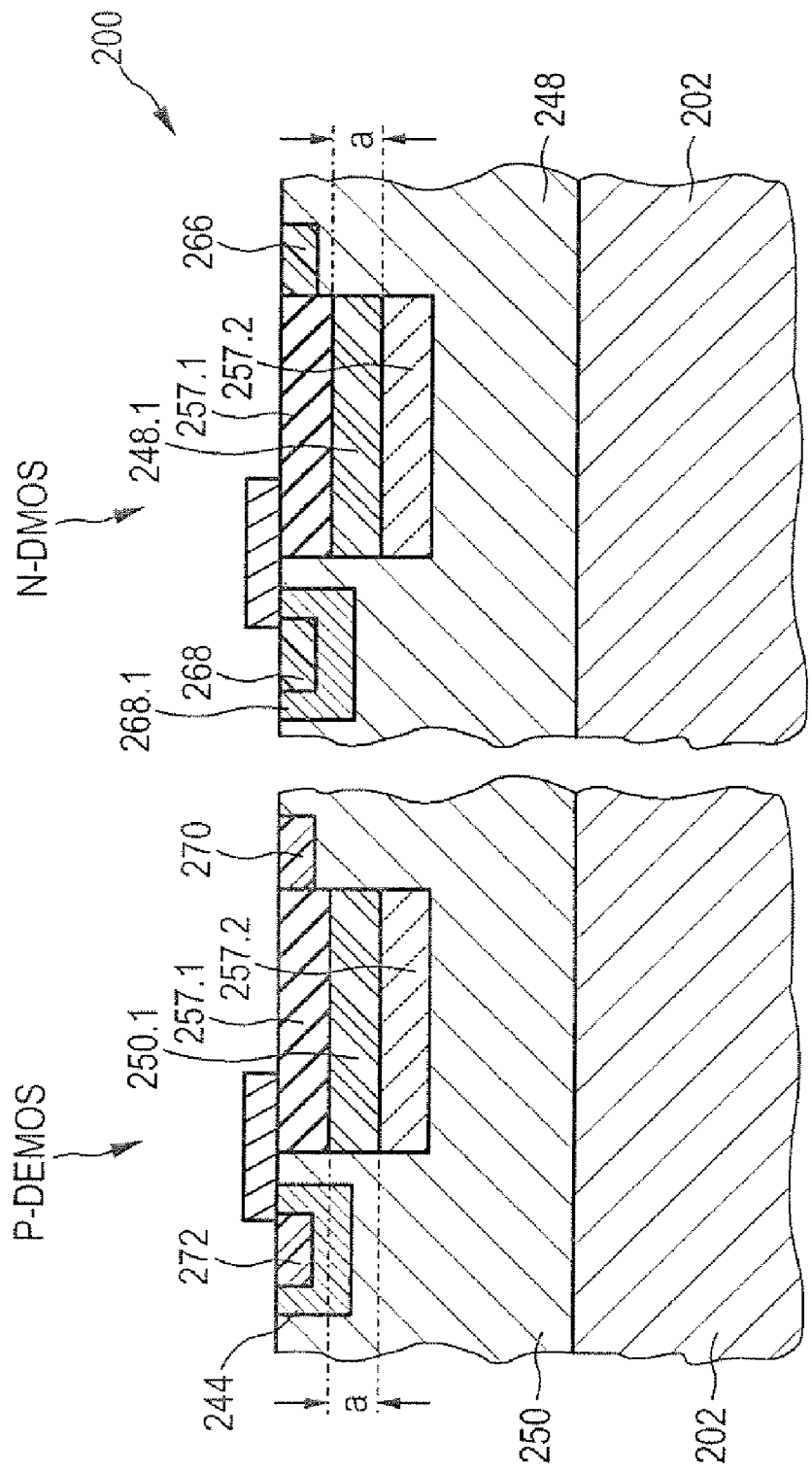
FIG. 16 shows a cross-sectional view of a wafer including a lateral n-channel high-voltage (NDMOS) transistor and a lateral p-channel high-voltage (PDEMOS) transistor.

FIG. 16 schematically shows a cross-sectional view of a wafer including a lateral n-channel high-voltage (N-DMOS) transistor and a lateral p-channel high-voltage (PEDMOS) transistor.

There are depicted two portions of a semiconductor device 200 that has been formed on a p+ wafer 202. The first wafer portion comprises the N-DMOS transistor in a first active region and is also denoted as "N-DMOS". The second portion comprises the P-DEMOS transistor in a second active region and is denoted as "P-DEMOS".

The N-DMOS transistor is formed in a deep n-conductive trench 248 that is also referred to as n-well. The transistor comprises a drain region 266, a source region 268 and a drift region 248.1. Above and below the drift region 248.1 of the height "a" there are doped RESURF regions 257.1 and 257.2 for a double RESURF structure. According to the claim language the doped RESURF region 257.1 and 257.2 are also denoted as first doped regions.

Moreover, a p-doped body implantation region 268.1 is implanted around the source region of the N-DMOS transistor and is also referred to as p-body region.

The second wafer section comprises the second lateral high-voltage P-DEMOS transistor. The P-DEMOS transistor comprises a source region 272, a drain region 270, a deep n-conductive trench 250 also referred to as n-well and, around the source region, an n-doped body implantation region 244. Furthermore, the lateral P-DEMOS transistor comprises a drift region section 250.1. A section of the drain extension region (drift region) 257.1 is positioned above the drift region 250.1.

The drain extension region 257.1 together with the drift region section 250.1 and a p-doped section 257.2 positioned below have the same vertical doping profile in the P-DEMOS transistor as the double RESURF structure in the N-DMOS transistor consisting of the doped RESURF regions 257.1, 257.2 in the N-DMOS transistor and the drift region section 248.1. The drift region section 250.1 may also be referred to as "doped RESURF region" in the P-DEMOS transistor.

Therefore, the fabrication of the drain extension region 257,1 in the P-DEMOS transistor and of the double RESURF structure in the N-DMOS transistor is accomplished in a single mask step, that is, using one the same implantation mask. In this way, the p-doped section 257.1 and 257.2 and the n-doped sections 248.1 and 250.1 are formed sequentially. The advantage of the method is that the double RESURF structure in the N-DMOS transistor can be formed concurrently together with the sections of the drain extension region in the P-DEMOS transistor. The vertical doping profile of the drain extension region and the drift region section in the P-DEMOS transistor as well as the double RESURF structure in the N-DMOS transistor comprises in an alternating manner p-doped and n-doped buried layers 257.1, 248.1, 250.1 and 250.2 that are parallel to the surface.

The embodiments described above are not to be understood as limiting embodiments but they may be varied within the scope as defined by the claims.

| Table of reference signs | |
|---|---|
| FIGS. 1 to 15 | |
| 100 | semiconductor device |
| PDEMOS | P-DEMOS transistor |
| NDMOS | N-DMOS transistor |
| 102 | p+ wafer (e.g. silicon) |
| 104 | p-epi layer (e.g. silicon) |
| 106 | pad oxide layer (e.g. thermal $SiO_2$) |
| 108 | cap layer (e.g. silicon nitride) |
| 110 | gate oxide layer of the P-DEMOS transistor |
| 112 | gate oxide layer of the N-DMOS transistor |
| 114 | second cap layer (e.g. silicon nitride) |
| 116 to 124 | shallow trenches |
| 126 | lithography mask |
| 128 | oxide liner |
| 130 | shallow trench isolation layer (e.g. $SiO_2$) |
| 132 | oxide layer |
| 134 | oxide layer |
| 136 | implantation mask |
| 138 | p-doped body implantation region, also referred to as p-body region |
| 140 | p-doped region |
| 142 | implantation mask |
| 144 | n-doped body implantation region, also referred to as n-body region |
| 146 | n-doped region |
| 148 | deep n-conductive trench |
| 150 | deep n-conductive trench |
| 152 | implantation mask |
| 154 | implantation mask |
| 154.1 | first mask opening for double RESURF structure |
| 154.2 | second mask opening for p-doped drain extension region |
| 156 | p-doped drain extension region |
| 157 | first p-doped region for double RESURF structure |
| 158 | temporary cap layer |
| 160 | insulator layer |
| 162 | gate oxide layer |
| 164 | gate oxide layer |
| 165 | implantation mask |
| 166 | drain region of the N-DMOS transistor |
| 168 | source region of the N-DMOS transistor |
| 168.1 | p-doped region of the source region |
| 168.2 | n-doped region of the source region |
| 170 | drain region of the P-DEMOS transistor |
| 172 | source region of the P-DEMOS transistor |
| 172.1 | n-doped region of the source region |
| 172.2 | p-doped region of the source region |
| FIG. 16 | |
| 200 | semiconductor device |
| PDEMOS | P-DEMOS transistor |
| NDMOS | N-DMOS transistor |
| 202 | p+ wafer (e.g. silicon) |
| 244 | n-doped body implantation region, also referred to as n-body region |
| 248 | deep n-conductive trench, also referred to as n-well |
| 248.1 | drift region section in the N-DMOS transistor |
| 250 | deep n-conductive trench, also referred to as n-well |
| 250.1 | drift region in the P-DEMOS transistor |
| 257.1, 257.2 | doped RESURF regions for double RESURF structure in the N-DMOS transistor and at the same time sections of the drain extension region (drift region) in the P-DEMOS transistor |
| 266 | drain region in the N-DMOS transistor |
| 268 | source region in the N-DMOS transistor |
| 268.1 | p-doped body implantation region, also referred to as p-body region |
| 270 | drain region of the P-DEMOS transistor |
| 272 | source region of the P-DEMOS transistor |

The invention claimed is:

1. A method of forming, on a substrate, a first lateral high-voltage MOS transistor and a second lateral high-voltage MOS transistor complementary to said first one, wherein said first and second lateral high-voltage MOS transistors, comprise drift regions, the method comprising the steps:

provide a substrate of a first conductivity type including a first active region for said first lateral high-voltage MOS transistor and a second active region for said second lateral high-voltage MOS transistor;

forming at least one first doped region of the first conductivity type in the first active region and forming in the second active region a drain extension region of the second conductivity type extending from a substrate surface to an interior of the substrate, including a concurrent implantation of dopants through mask openings of one and the same mask into the first and second active regions, wherein the forming of the at least one first doped region is a sub step of a superior step of forming a double RESURF structure in the first lateral high-voltage MOS transistor, and wherein forming the double RESURF structure comprises:

forming doped RESURF regions as two first doped regions, one thereof above and one thereof below the drift region of the first lateral high-voltage MOS transistor, and as two further doped regions, one thereof above and one thereof below the drain extension regions of the second lateral high-voltage MOS transistor, wherein the first doped RESURF regions have an inverse conductivity type with respect to the drift region and the further doped regions have inverse conductivity type as compared to the drain extension region.

2. The method of claim 1, wherein a plurality of first doped regions that are laterally offset from each other is formed in the first active region.

3. The method of claim 1, comprising the steps performed prior to said implantation step:
blanket-depositing a mask layer on the substrate;
forming at least a first mask opening for the implantation of the first doped region in the first active region and a second mask opening for the implantation of the drain extension region in the second active region.

4. The method of claim 1, wherein providing the substrate comprises forming a trench, partially or completely filled with an electrically insulating material, either exclusively in the first active region or in the first and second active regions in the lateral area of a respective future drift region of the lateral high-voltage MOS transistor to be formed in this area.

5. The method of claim 4, wherein the first doped region of the first conductivity type is exclusively formed below said trench.

6. The method of claim 4, wherein the implantation of the dopants into said at least one first doped region is performed through at least one first mask opening, which with respect to a cross-section of said emerging lateral high-voltage MOS transistor forces a lateral restriction of the first doped region to maximal the lateral extension of the trench.

7. The method of claim 1, wherein the substrate of the p-conductivity type is provided.

8. The method of claim 1, wherein the substrate of the n-conductivity type is provided.

9. The method of claim 1, wherein providing the substrate comprises laterally delineating the active regions by field isolation regions.

10. The method of claim 9, wherein providing the substrate comprises forming a trench in shallow trench technology together said field isolation regions.

11. The method of claim 1, wherein, after forming the first doped region in the first lateral high-voltage MOS transistor and the drain extension region in the second lateral high-voltage MOS transistor, source and drain regions are formed in the respective lateral high-voltage MOS transistor.

12. The method of claim 4, wherein prior to forming the first doped region a gate insulation layer is formed that partially or completely overlaps laterally with said trench.

13. The method of claim 1, wherein forming the at least one first doped region in the first active region and the drain extension region in the second active region comprises a sequence of implantation steps with n-dopants and p-dopants of different implantation energy so as to form a vertical layer stack of alternating p- and n-doped layers parallel to the surface.

* * * * *